(12) United States Patent
Lee et al.

(10) Patent No.: US 6,298,001 B1
(45) Date of Patent: Oct. 2, 2001

(54) SEMICONDUCTOR MEMORY DEVICE ENABLING DIRECT CURRENT VOLTAGE TEST IN PACKAGE STATUS

(75) Inventors: Seung-hun Lee, Suwon; Tae-jin Kim, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 08/636,428

(22) Filed: Apr. 23, 1996

(30) Foreign Application Priority Data

Apr. 24, 1995 (KR) .................................................. 95-9642

(51) Int. Cl.[7] ............................. G11C 17/00; G11C 14/00
(52) U.S. Cl. ............................ 365/226; 307/64; 327/530; 324/765
(58) Field of Search .................................... 365/226, 229, 365/227; 307/64; 327/530; 324/765

(56) References Cited

U.S. PATENT DOCUMENTS

| | | | |
|---|---|---|---|
| 5,251,179 | * | 10/1993 | Wittman ................................ 365/227 |
| 5,280,455 | * | 1/1994 | Kanaishi ............................... 365/229 |
| 5,297,097 | * | 3/1994 | Etoh et al. ............................ 365/226 |
| 5,446,408 | * | 8/1995 | Tedrow et al. ........................ 327/530 |
| 5,594,360 | * | 1/1997 | Wojciechowski .................... 324/771 |
| 5,602,794 | * | 2/1997 | Javanifard et al. .................. 365/226 |

FOREIGN PATENT DOCUMENTS

| 4-258893 | * | 9/1992 | (JP) . |
| 4-258893 | * | 9/1993 | (JP) . |

\* cited by examiner

Primary Examiner—Viet Q. Nguyen
(74) Attorney, Agent, or Firm—Jones Volentine, P.L.L.C.

(57) ABSTRACT

A semiconductor memory device for a package-state voltage test has a plurality of bonding pads that are electrically connected to an external device in a package state, at least one internal DC voltage generator, at least one switch connected between one of the bonding pads and the internal DC voltage generator. The switch is on during a test mode and is off during a normal mode. The switch controller is connected between at least two of the plurality of bonding pads and serves to control the switch in response to an external switching signal in the test mode. Because of this design, a number of DC voltage tests can be performed without increasing chip size since a general control pad also serves as a DC voltage test pad.

4 Claims, 1 Drawing Sheet

SEMICONDUCTOR MEMORY DEVICE ENABLING DIRECT CURRENT VOLTAGE TEST IN PACKAGE STATUS

BACKGROUND OF THE INVENTION

The present invention relates to a semiconductor memory device. More particularly the present invention relates to a semiconductor memory device that allows for a direct current (DC) voltage test after packaging.

Recently, semiconductor memory devices have been designed to provide higher integration, multiple functions, and lower power dissipation. In response to these trends, the number of bonding pads 20 used to control a semiconductor device 15 have increased, as shown in FIG. 1. This larger number of bonding pads 20 allows for high integration and multiple input and output functions. In addition to an increase in the number of bonding pads 20, the number of DC voltage generators 10 of differing voltage levels in the semiconductor device 15 has also increased, resulting in an increase in the number of checking pads 22 required to check the voltage levels of these voltage generators. These DC voltage generators 10 are required for controlling power in the semiconductor device 15, but the addition of the checking pads 22 serves to undesirably increase the chip size.

The checking pads 22 can be used to perform electrical tests regarding the status of the semiconductor deceive 15 when they are linked to probes connected to electrical test equipment. However, the DC voltage level of each checking pad 22 cannot be measured before the checking pads 22 are bonded with package leads, and so cannot be measured until the wafer assembly of the semiconductor device 15 is completed. As a result, it is extremely difficult, if not impossible, to find out how the assembly process in particular impacts on the DC voltage levels measured once the wafer is fully assembled.

Furthermore, the addition of more checking pads 22 to measure the DC voltage of the packaged semiconductor device 15 entails an undesirable increase in chip size and cost.

SUMMARY OF THE INVENTION

It is therefore an object of the present invention to provide a semiconductor memory device for which a DC voltage test is possible even when in package form.

To achieve the above object, there is provided a semiconductor memory device comprising [claim 1]

According to the present invention, as set forth in the appended claims, many types of DC voltage tests can be performed without an increase in chip size, since a general control pad serves also as a DC voltage test pad.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

Figure 1:
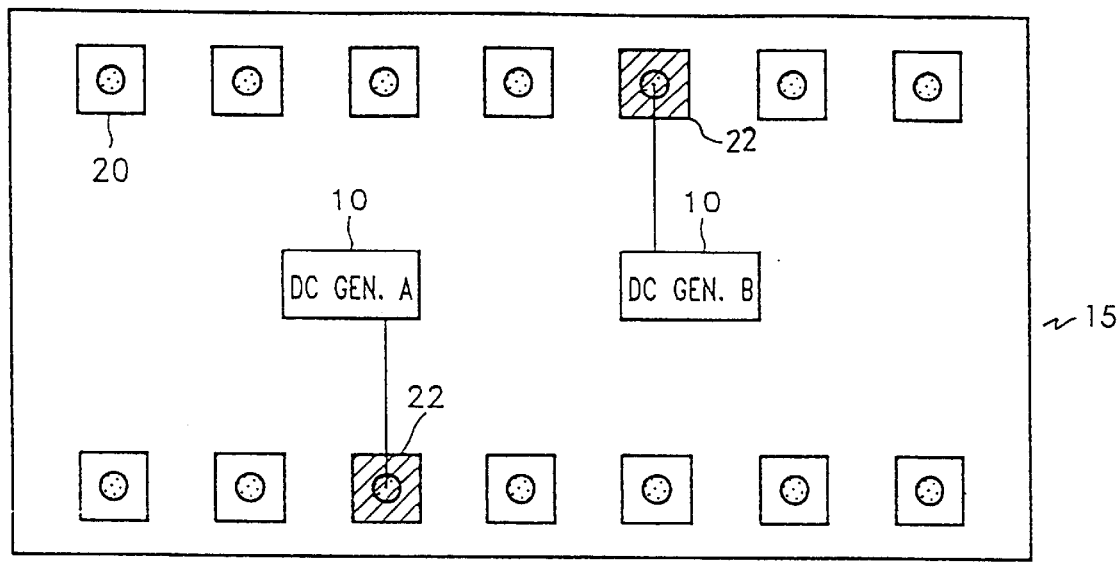
FIG. 1 illustrates a conventional semiconductor memory device for which a DC voltage test is possible only when the device is in a wafer state, but not when the device is in a package state.
Figure 2:
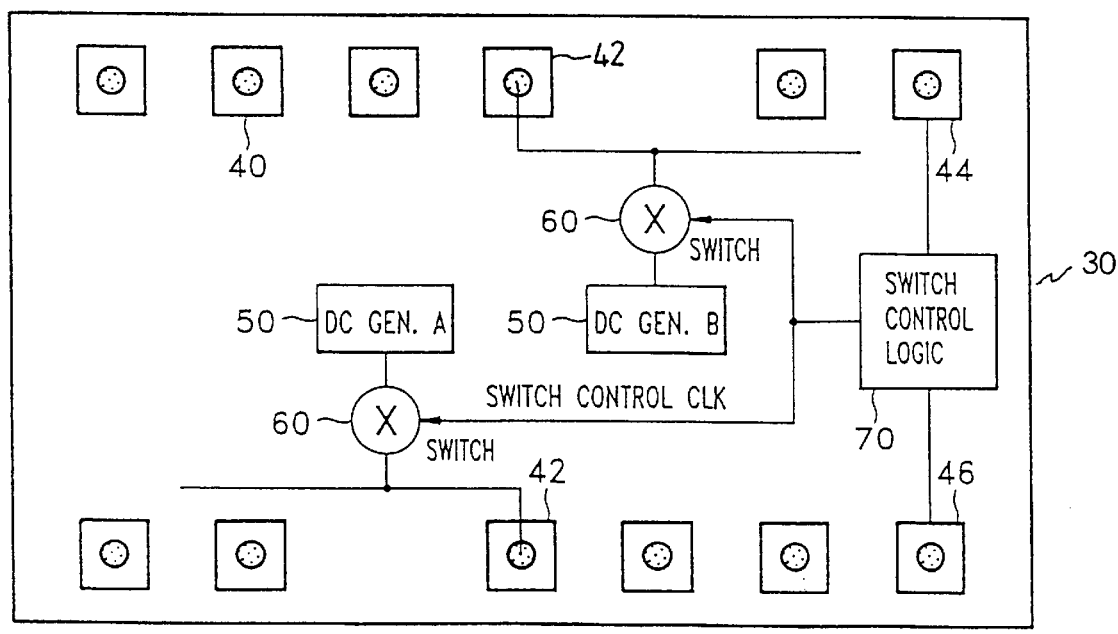
FIG. 2 illustrates a semiconductor memory device for which a DC voltage test is possible in a package state, according to a preferred embodiment of the current invention.

FIG. 2 illustrates a semiconductor memory device 30 for which a DC voltage test is possible in a package state, according to a preferred embodiment of the current invention. The semiconductor memory device 30 of this embodiment includes a plurality of bonding pads 40, 42, 44, and 46, a plurality of internal DC voltage generators 50, a plurality of switches 60, and switching control logic 70 connected to two of the bonding pads 44 and 46. The plurality of internal DC voltage generators 50 are turned on during a test mode and are turned off in a normal mode. The switching controller 70 controls the switches 60 in response to a test driving signal provided externally in the test mode.

The semiconductor memory device 30 described above operates as follows. In a package state, when the test driving signal is provided to bonding pads 44 and 46, the switch control logic 70 is enabled and generates a switching control signal. The switches 60 turn on in response to the generated switching control signal, and thus the output of the plurality of internal DC voltage generators 50 are applied to respective bonding pads 42 through the switches 60. Thus, the levels of DC voltage generators 50 can be externally measured in a package state.

Since switch control logic 70 is kept disabled during normal operation, the switching control signal is not generated and the switches 60 remain off during normal operation. Therefore, bonding pads 42 are electrically isolated from DC voltage generators 50 during normal operation, and can serve as general control pads for inputting and outputting signals generated to and from an internal circuit.

As described above, in the present invention, a DC voltage level of the packaged semiconductor device 30 can be measured without increasing the number of pads in the device, since the bonding pads 42 serves for inputting a signal, outputting a signal, and testing a DC voltage. In other words, the general control pad serving as a DC voltage test pad contributes to the suppression of an increase in the chip size and enables many types of DC voltage tests in a package state.

The present invention is not limited to the above-described embodiments. Various changes and modifications may be effected by one having an ordinary skill in the art and remain within the scope of the invention, as defined by the appended claims.

What is claimed:

1. A semiconductor memory device, comprising:
  a plurality of bonding pads serving as input and output pins during normal operation of the semiconductor memory device;
  one or more internal voltage generators, each connected to one of the plurality of bonding pads;
  one or more switches, each connected between one of the one or more internal voltage generators and one of the plurality of bonding pads; and
  switch control logic for generating a switching control signal to activate the one or more switches during a package state,
  wherein the one or more switches remain deactivated and open during normal operation of the semiconductor memory device, isolating the plurality of bonding pads from the one or more internal voltage generators.

2. A semiconductor device, as recited in claim 1, wherein the switch control logic is controlled by two or more of the plurality of bonding pads and is kept deactivated during normal operation of the semiconductor device.

3. A semiconductor device, as recited in claim 2, wherein the two or more bonding pads used to control the switch control logic are used as input and output pins for the semiconductor device during normal operation.

4. A semiconductor device, as recited in claim 1, wherein the plurality of switches are normally-off switches.

* * * * *